US012796042B2

(12) United States Patent
Nishiguchi

(10) Patent No.: US 12,796,042 B2
(45) Date of Patent: Nov. 10, 2026

(54) METHOD FOR MANUFACTURING SEMICONDUCTOR DEVICE

(71) Applicant: Mitsubishi Electric Corporation, Tokyo (JP)

(72) Inventor: Kohei Nishiguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 347 days.

(21) Appl. No.: 18/711,512

(22) PCT Filed: Mar. 17, 2022

(86) PCT No.: PCT/JP2022/012168
§ 371 (c)(1),
(2) Date: May 17, 2024

(87) PCT Pub. No.: WO2023/175820
PCT Pub. Date: Sep. 21, 2023

(65) Prior Publication Data

US 2025/0022922 A1 Jan. 16, 2025

(51) Int. Cl.
*H10D 30/01* (2025.01)
*H10D 62/83* (2025.01)
*H10D 64/01* (2025.01)

(52) U.S. Cl.
CPC ........... *H10D 64/01* (2025.01); *H10D 30/061* (2025.01); *H10D 62/83* (2025.01); *H10D 64/011* (2026.01); *H10D 64/0125* (2026.01)

(58) Field of Classification Search
None
See application file for complete search history.

(56) References Cited

U.S. PATENT DOCUMENTS

2008/0290372 A1 11/2008 Makiyama
2009/0108299 A1* 4/2009 Smorchkova ........ H10D 30/015 257/E21.403
(Continued)

FOREIGN PATENT DOCUMENTS

JP H06-053246 A 2/1994
JP 2009-105405 A 5/2009
(Continued)

OTHER PUBLICATIONS

International Search Report issued in PCT/JP2022/012168; mailed Jun. 14, 2022.

*Primary Examiner* — Cory W Eskridge
(74) *Attorney, Agent, or Firm* — Studebaker Brackett PLLC

(57) ABSTRACT

A method for manufacturing a semiconductor device includes forming a first insulating film including a first opening; forming, on the first insulating film, a first resist including a second opening larger than the first opening; forming a gate electrode in the first opening, in the second opening, above the second opening, and on the first resist; forming a second resist on the gate electrode, the second resist covering at least a region above the second opening in the vertical direction, the second resist being wider than the second opening; etching the gate electrode and up to the middle of the first resist using the second resist as a mask; removing the first resist and the second resist; and forming a second insulating film covering an exposed portion of the gate electrode and an exposed portion of the first insulating film.

7 Claims, 10 Drawing Sheets

(56) References Cited

U.S. PATENT DOCUMENTS

| | | | | |
|---|---|---|---|---|
| 2020/0013862 | A1* | 1/2020 | Srivastava | H10D 30/015 |
| 2020/0357644 | A1* | 11/2020 | Nishiguchi | H10D 30/015 |
| 2022/0130965 | A1* | 4/2022 | Bothe | H10D 30/015 |
| 2022/0310803 | A1* | 9/2022 | Watanabe | H10D 30/015 |
| 2023/0094768 | A1* | 3/2023 | Nose | H10D 30/015 257/76 |

FOREIGN PATENT DOCUMENTS

| | | | |
|---|---|---|---|
| JP | 2011-216627 | A | 10/2011 |
| WO | 2007/091301 | A1 | 8/2007 |

* cited by examiner

METHOD FOR MANUFACTURING SEMICONDUCTOR DEVICE

FIELD

The present disclosure relates to a method for manufacturing a semiconductor device, and in particular, to a method for forming a gate electrode.

BACKGROUND

Among semiconductor devices is a semiconductor device that includes a source electrode, a gate electrode, and a drain electrode, each formed on a semiconductor substrate. For such a semiconductor device, the resistance of the gate electrode is desirably reduced to improve high frequency characteristics.

Patent Literature 1 discloses a method for manufacturing a semiconductor device including a gate electrode that has a T-shaped gate electrode structure and thus has reduced resistance.

CITATION LIST

Patent Literature

[PTL 1] JP 2009-105405 A

SUMMARY

Technical Problem

However, the method for manufacturing the semiconductor device disclosed in Patent Literature 1 involves a lift-off method for the production of the gate electrode. Thus, it would be impossible to set the height of the gate electrode as well as the width of the upper portion of the gate electrode to a given length or greater. Therefore, the resistance of the gate electrode cannot be significantly reduced.

The present disclosure has been made to solve the foregoing problem, and it is an object of the present disclosure to obtain a method for manufacturing a semiconductor device including a gate electrode with reduced resistance.

Solution to Problem

A method for manufacturing a semiconductor device according to the present disclosure includes a step of forming a source electrode and a drain electrode on a semiconductor substrate; a step of forming, on the source electrode, the drain electrode, and the semiconductor substrate, a first insulating film including a first opening at a position between the source electrode and the drain electrode; a step of forming, on the first insulating film, a first resist including a second opening above the first opening, the second opening being larger than the first opening; a step of forming a gate electrode in the first opening, in the second opening, above the second opening, and on the first resist so as to allow the gate electrode to be in contact with the semiconductor substrate via the first opening; a step of forming a second resist on the gate electrode, the second resist covering at least a region above the second opening in a vertical direction, the second resist being wider than the second opening; a step of etching the gate electrode and up to the middle of the first resist, using the second resist as a mask; a step of removing the first resist and the second resist; and a step of forming a second insulating film covering an exposed portion of the gate electrode and an exposed portion of the first insulating film.

Advantageous Effects of Invention

With the method for manufacturing a semiconductor device according to the invention of the present disclosure, it is possible to obtain a semiconductor device including a gate electrode with reduced resistance.

DESCRIPTION OF EMBODIMENTS

Embodiment 1

Figure 1:
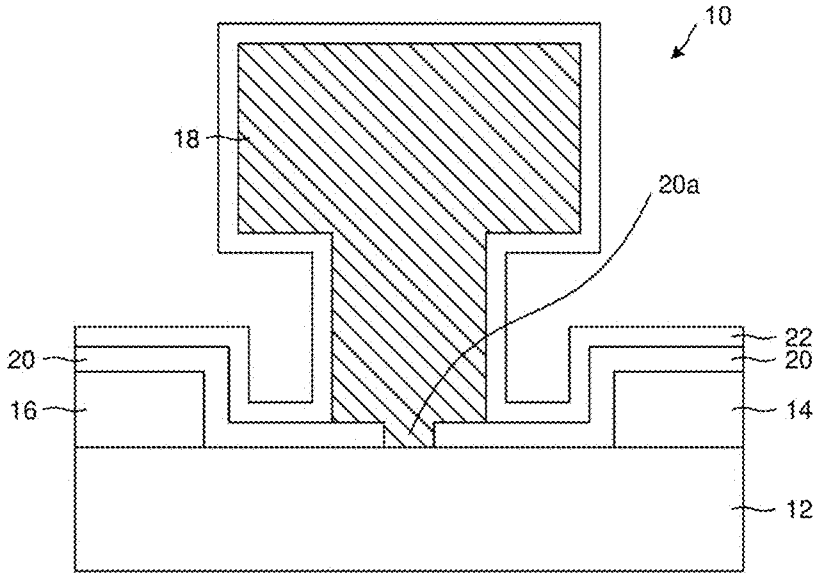
FIG. 1 illustrates a cross-sectional view of the semiconductor device according to Embodiment 1.

A semiconductor device 10 according to Embodiment 1 is a high electron mobility transistor (HEMT). FIG. 1 illustrates a cross-sectional view of the semiconductor device 10 according to Embodiment 1.

The semiconductor device 10 includes a semiconductor substrate 12. The semiconductor substrate 12 is made of GaN or AlGaAs.

A source electrode 14 and a drain electrode 16 are formed on the semiconductor substrate 12.

A first insulating film 20 is formed on the source electrode 14, the drain electrode 16, and the semiconductor substrate 12. A first opening 20*a* is formed in the first insulating film 20 at a position between the source electrode 14 and the drain electrode 16.

A gate electrode 18 is formed so as to be in contact with the semiconductor substrate 12 via the first opening 20*a*. The gate electrode 18 is a T-shaped gate with its upper portion protruding to both the side of the source electrode 14 and the side of the drain electrode 16. Note that the upper portion of the gate electrode 18 may protrude to only one of the side of the source electrode 14 or the side of the drain electrode 16. That is, it is acceptable as long as the gate electrode 18 has an upper portion wider than its lower portion.

A second insulating film 22 is formed to cover the gate electrode 18 and the first insulating film 20.

A method for manufacturing the semiconductor device 10 according to Embodiment 1 will be described hereinafter.

Figure 2:
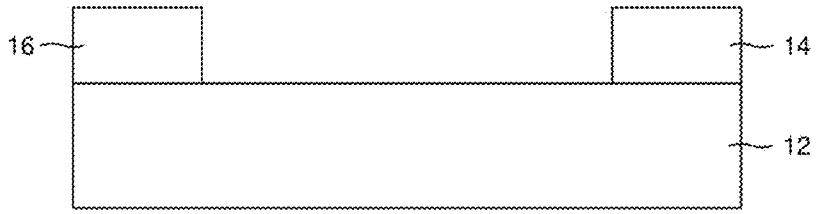
FIG. 2 is a cross-sectional view of the semiconductor device showing the method for manufacturing the semiconductor device according to Embodiment 1.

First, as illustrated in FIG. 2, the source electrode 14 and the drain electrode 16 are formed on the semiconductor substrate 12.

Figure 3:
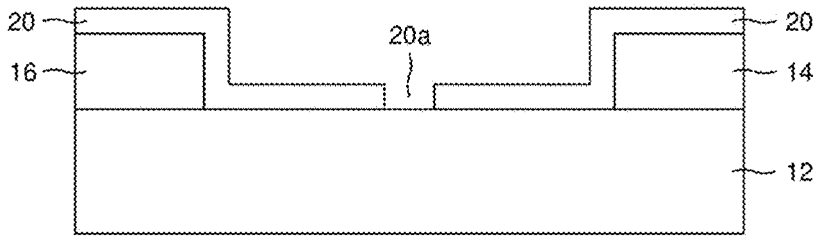
FIG. 3 is a cross-sectional view of the semiconductor device showing the method for manufacturing the semiconductor device according to Embodiment 1.

Next, as illustrated in FIG. 3, the first insulating film 20 is formed. As a method for forming the first insulating film 20, a chemical vapor deposition method (i.e., a plasma method or a heating method), a sputtering method, an electron beam vapor deposition method, or an atomic layer deposition method is used, for example. The first opening 20*a* of the first insulating film 20 is formed by a dry etching method using a resist. As a method for forming the resist, it is possible to use a method of forming a micropattern using electron beam exposure, or a method that includes forming a pattern with a submicron width through optical exposure, and then forming a micropattern using a shrink agent.

Figure 4:
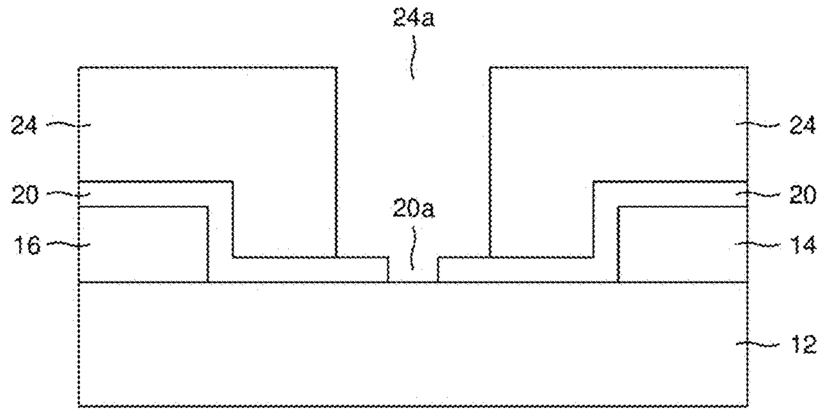
FIG. 4 is a cross-sectional view of the semiconductor device showing the method for manufacturing the semiconductor device according to Embodiment 1.

Next, as illustrated in FIG. 4, a first resist 24 is formed. The first resist 24 is formed such that it has a second opening 24*a*, which is larger than the first opening 20*a*, above the first opening 20*a*.

Figure 5:
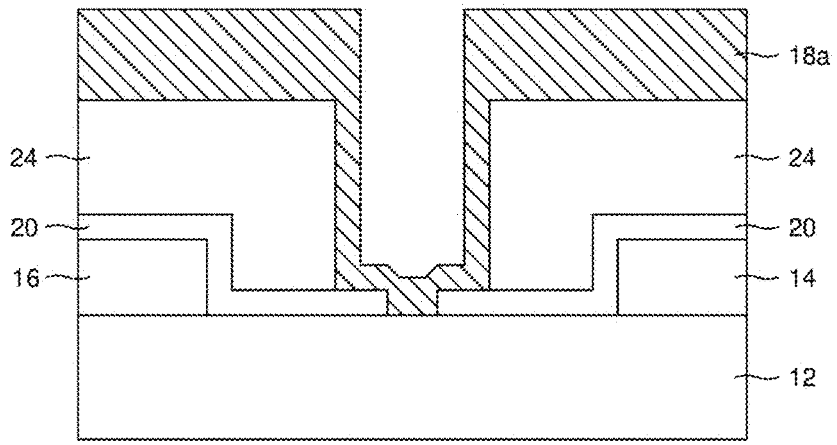
FIG. 5 is a cross-sectional view of the semiconductor device showing the method for manufacturing the semiconductor device according to Embodiment 1.
Figure 6:
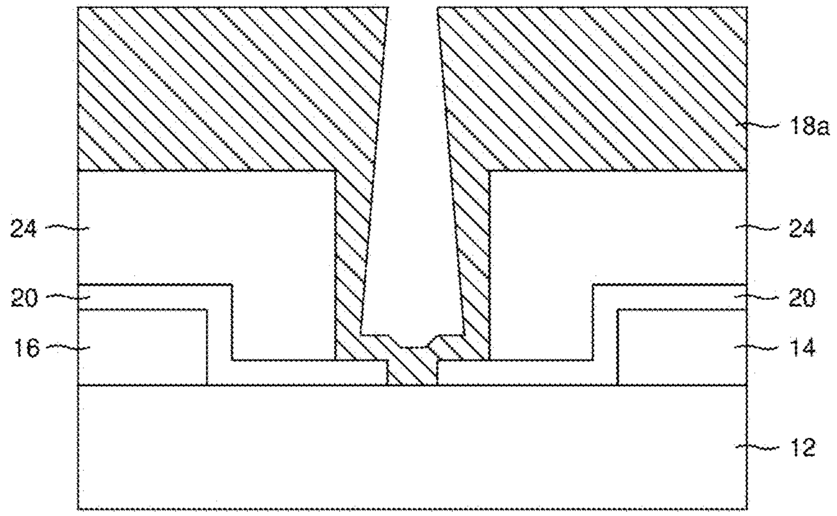
FIG. 6 is a cross-sectional view of a semiconductor device showing a manufacturing method of a comparative example.

Next, as illustrated in FIG. 5, a first metal layer 18*a* is formed. The first metal layer 18*a* is formed on the first resist 24, on a side surface of the second opening 24*a* of the first resist 24, on the first insulating film 20, and in the first opening 20*a*. As a material of the first metal layer 18*a*, a material to form a Schottky junction with the semiconductor substrate 12 is selected. Specifically, Ni, Pt, TaN, W, WN, Pd, or TiN is selected, for example. As a method for forming the first metal layer 18*a*, a sputtering method or an electron beam vapor deposition is used, for example. At this time, if the ratio between the height and the width (i.e., aspect ratio) of the second opening 24*a* is high, it would be difficult for the material of the first metal layer 18*a* to enter into the first resist 24 even if the first metal layer 18*a* is formed thick. Then, the first metal layer 18*a* would grow in a reverse tapered shape as illustrated in FIG. 6, and a void would remain thereafter. To prevent this, the following steps are performed.

Figure 7:
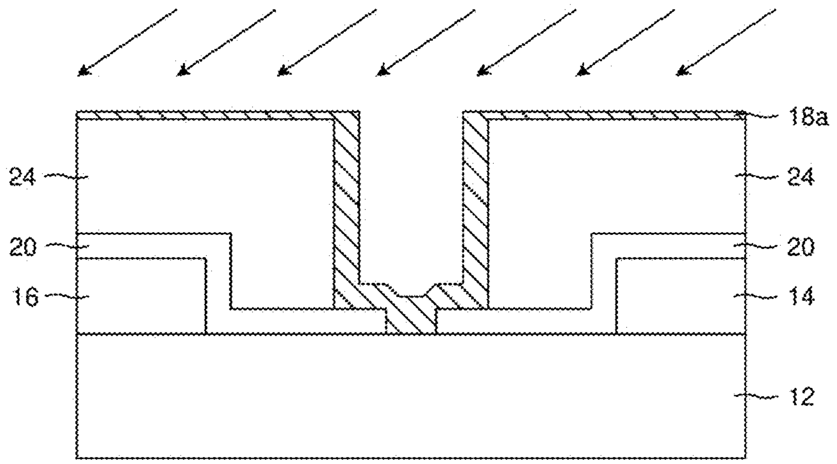
FIG. 7 is a cross-sectional view of the semiconductor device showing the method for manufacturing the semiconductor device according to Embodiment 1.

Next, as illustrated in FIG. 7, the first metal layer 18*a* on the first resist 24 is etched. As the etching method herein, an oblique-incidence ion milling method is used. In the ion milling method, inert gas ions (e.g., Ar ions) are drawn toward the substrate so that a surface of the substrate that has collided with the Ar ions is etched. At this time, controlling the angle of incidence of the Ar ions on the semiconductor substrate 12 can etch only the first metal layer 18*a* on the first resist 24. The angle of incidence of the Ar ions on the semiconductor substrate 12 is determined based on the width of the opening of the first resist 24 and the thickness of the first metal layer 18*a*. At this time, the first metal layer 18*a* on the first resist 24 need not be entirely removed.

Figure 8:
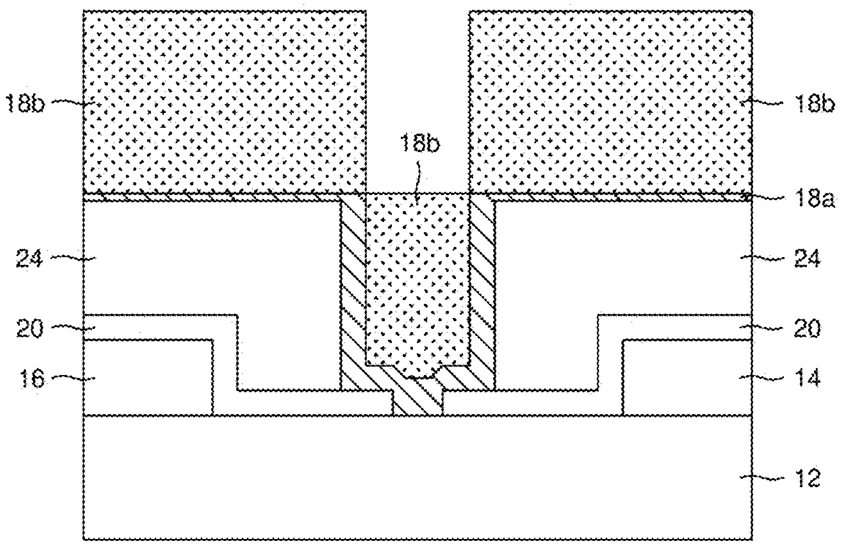
FIG. 8 is a cross-sectional view of the semiconductor device showing the method for manufacturing the semiconductor device according to Embodiment 1.

Next, as illustrated in FIG. 8, a second metal layer 18*b* is formed on the first metal layer 18*a*. The material of the second metal layer 18*b* is the same as that of the first metal layer 18*a*. Since the materials of the metal layers are the same, the second opening 24*a* can be filled with the second metal layer 18*b*. As a method for forming the second metal layer 18*b*, an electron beam vapor deposition method is used. The angle of incidence of a vapor deposition material is set perpendicular to the semiconductor substrate 12.

Figure 9:
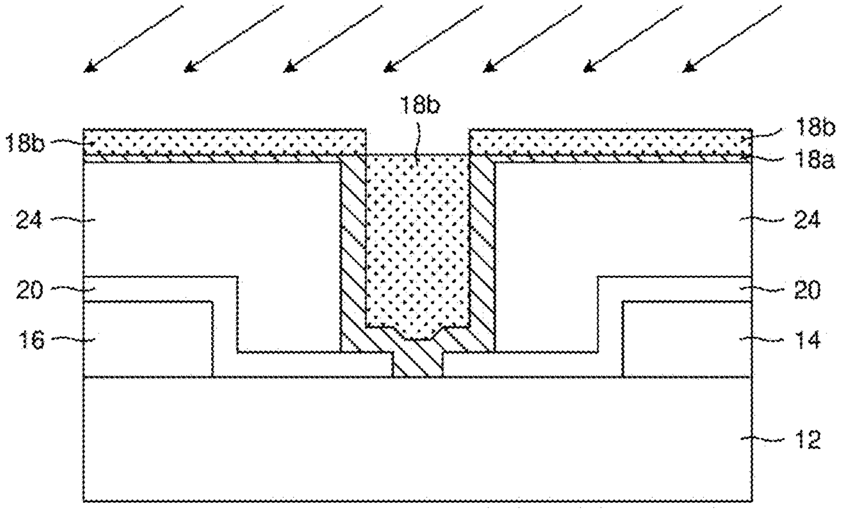
FIG. 9 is a cross-sectional view of the semiconductor device showing the method for manufacturing the semiconductor device according to Embodiment 1.

Next, as illustrated in FIG. 9, the second metal layer 18*b* over the first resist 24 is etched. As the etching method herein, an ion milling method is used as with the etching of the first metal layer 18*a*. Performing the etching herein can improve the flatness of the second metal layer 18*b*.

Figure 10:
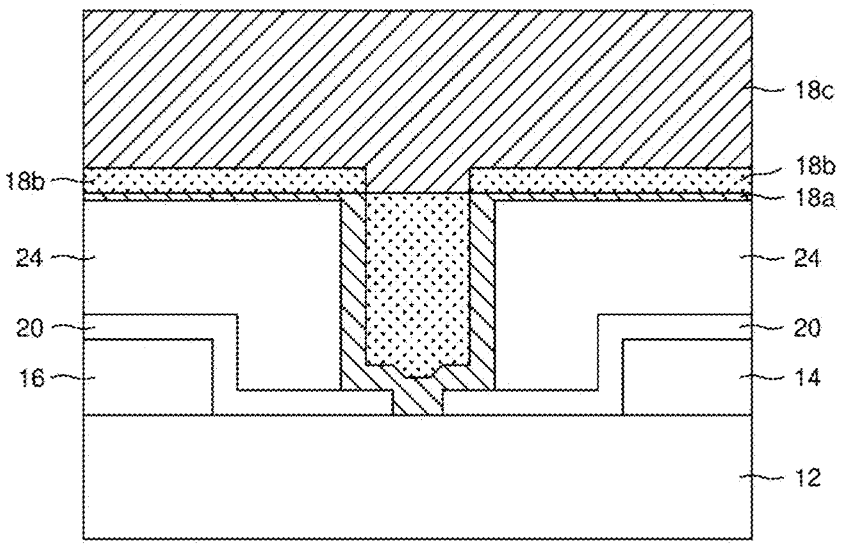
FIG. 10 is a cross-sectional view of the semiconductor device showing the method for manufacturing the semiconductor device according to Embodiment 1.

Next, as illustrated in FIG. 10, a third metal layer 18*c* is formed on the second metal layer 18*b*. The material of the third metal layer 18*c* is the same as that of the second metal layer 18*b*. As a method for forming the third metal layer 18*c*, any method that can deposit the third metal layer 18*c* at a temperature lower than or equal to the heat-resistant temperature of the first resist 24 may be used, such as a sputtering method or an electron beam vapor deposition method.

Figure 11:
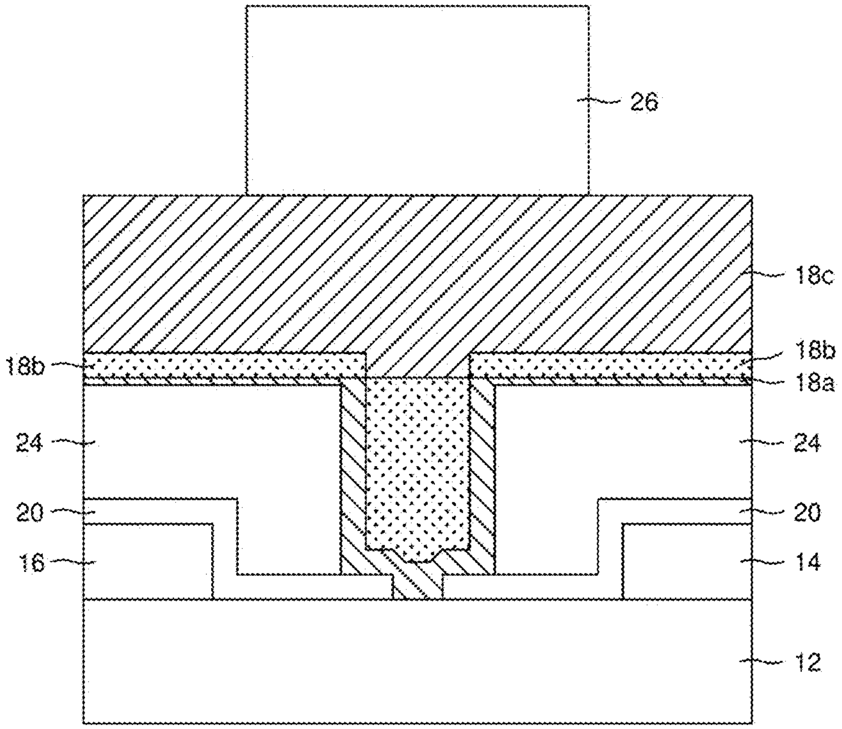
FIG. 11 is a cross-sectional view of the semiconductor device showing the method for manufacturing the semiconductor device according to Embodiment 1.

Next, as illustrated in FIG. 11, a second resist 26 is formed on the gate electrode 18. At this time, the second resist 26 is formed so as to cover at least a region above the second opening 24*a* in the vertical direction such that the second resist 26 is wider than the second opening 24*a*.

Figure 12:
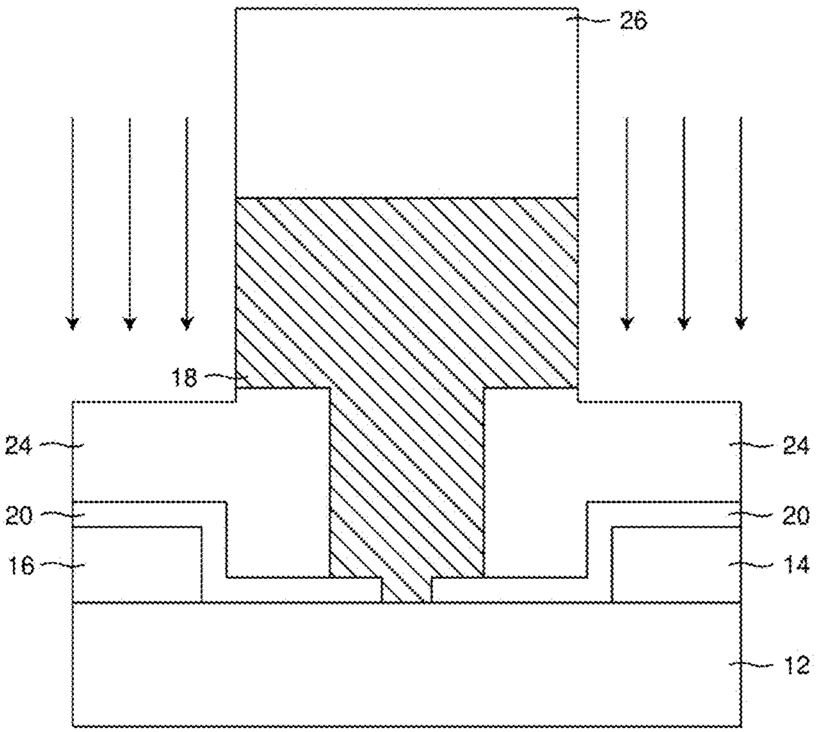
FIG. 12 is a cross-sectional view of the semiconductor device showing the method for manufacturing the semiconductor device according to Embodiment 1.

Next, as illustrated in FIG. 12, the gate electrode 18 and the first resist 24 are etched up to the middle of the first resist 24 using the second resist 26 as a mask. Note that in FIG. 12, a combination of the first metal layer 18*a*, the second metal layer 18*b*, and the third metal layer 18*c* is indicated as the gate electrode 18.

Figure 13:
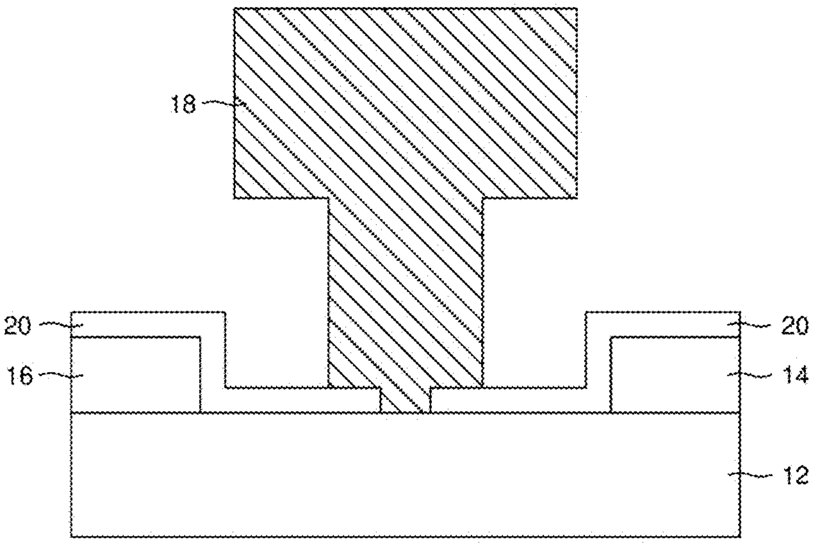
FIG. 13 is a cross-sectional view of the semiconductor device showing the method for manufacturing the semiconductor device according to Embodiment 1.

Next, as illustrated in FIG. 13, the first resist 24 and the second resist 26 are removed. Examples of the removal method herein include a dry ashing method and a method that involves the use of a chemical solution for removing the resist.

Next, the second insulating film 22 is formed. This completes the formation of the semiconductor device 10 in FIG. 1. The second insulating film 22 is formed to cover the exposed portion of the gate electrode 18 and the exposed portion of the first insulating film 20.

As described above, according to the method for manufacturing the semiconductor device of this embodiment, it is possible to form the tall gate electrode 18 by filling the second opening 24*a* of the first resist 24 with the second metal layer 18*b* and also by forming the third metal layer 18*c*. Further, the width of the upper portion of the gate electrode 18 can be controlled with the second resist 26, and can thus be significantly increased as compared to when a lift-off method is used. Accordingly, the gate electrode 18 has low resistance.

Embodiment 2

Figure 14:
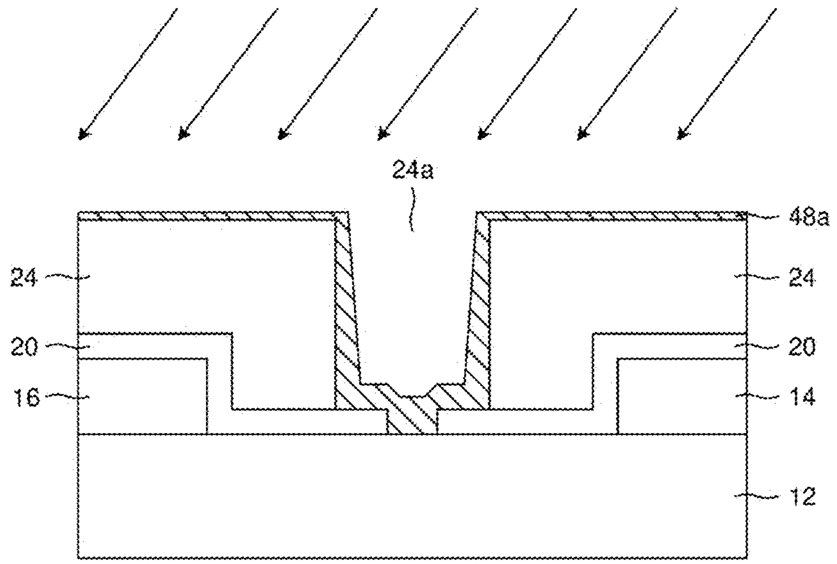
FIG. 14 is a cross-sectional view of the semiconductor device showing the method for manufacturing the semiconductor device according to Embodiment 2.

A method for manufacturing a semiconductor device according to Embodiment 2 is similar to Embodiment 1 except the formation of a first metal layer 48*a*. In Embodiment 1, as illustrated in FIG. 5, a side surface of a cavity in the first metal layer 18*a* formed in the second opening 24*a* is substantially perpendicular, while in Embodiment 2, as illustrated in FIG. 14, the first metal layer 48*a* is formed to allow a side surface of a cavity to be tapered.

A method for forming the first metal layer 48*a* will be described. After the first metal layer is formed as illustrated in FIG. 5, the first metal layer 48*a* is etched using an oblique-incidence ion milling method so as to allow the inside of the second opening 24*a* to be tapered. At this time, the angle of incidence of inert gas ions is set smaller than that in Embodiment 1. That is, the angle is adjusted to nearly 90 degrees so that the tapered first metal layer 48*a* is obtained.

As described above, according to the method for manufacturing the semiconductor device of this embodiment, the side surface of the cavity in the first metal layer 48*a* is allowed to be tapered. This allows the cavity to be easily filled with a second metal layer to be stacked later, and thus reduces the resistance of the gate electrode and improves the reliability of the device.

Embodiment 3

Figure 15:
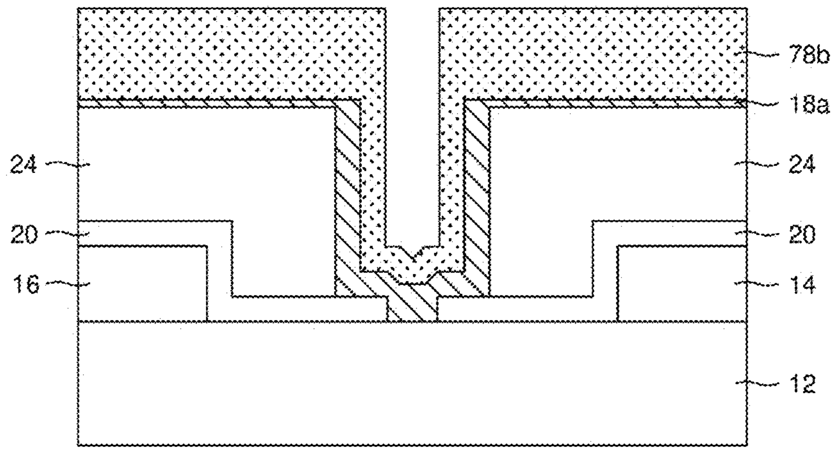
FIG. 15 is a cross-sectional view of the semiconductor device showing the method for manufacturing the semiconductor device according to Embodiment 3.

A method for manufacturing a semiconductor device according to Embodiment 3 is similar to Embodiment 1 except the formation of metal layers. In Embodiment 1, as illustrated in FIG. 8, an electron beam vapor deposition method in which the angle of incidence of a vapor deposition material is set perpendicular to the semiconductor substrate is used, while in Embodiment 3, as illustrated in FIG. 15, a second metal layer 78*b* is formed to cover the entire first metal layer 18*a*. In addition, the first metal layer 18*a* and a third metal layer 78*c* are also formed using the electron beam vapor deposition method.

A method for forming the second metal layer 78*b* will be described. After the first metal layer is etched as illustrated in FIG. 7, the second metal layer 78*b* is formed to cover the entire first metal layer 18*a* as illustrated in FIG. 15. As a method for forming the second metal layer 78*b*, the electron beam vapor deposition method is used.

Figure 16:
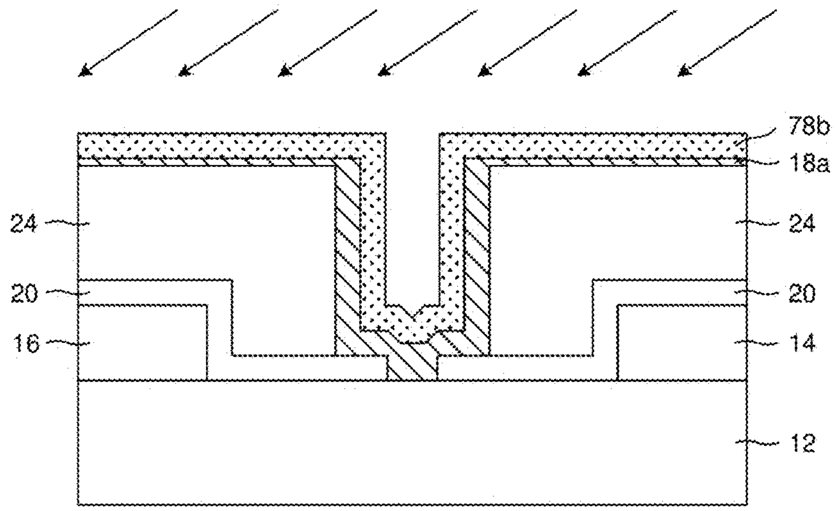
FIG. 16 is a cross-sectional view of the semiconductor device showing the method for manufacturing the semiconductor device according to Embodiment 3.
Figure 17:
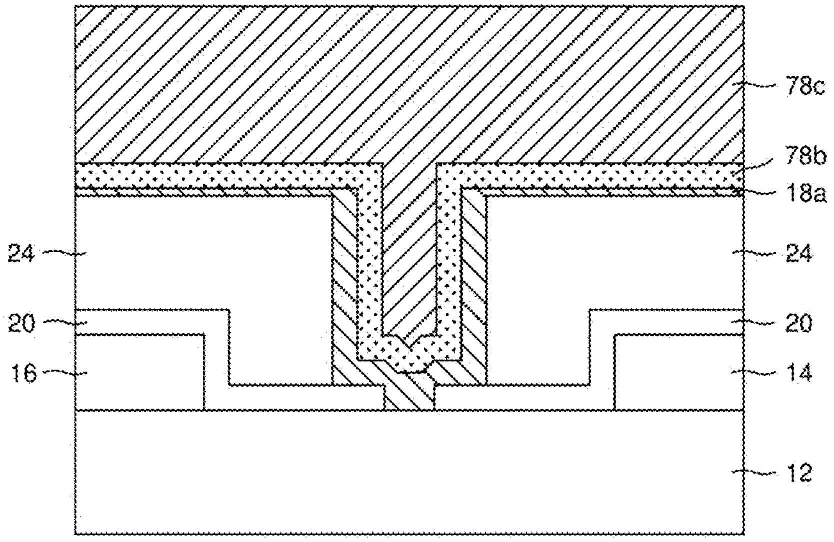
FIG. 17 is a cross-sectional view of the semiconductor device showing the method for manufacturing the semiconductor device according to Embodiment 3.

Next, as illustrated in FIG. 16, the second metal layer 78*b* is etched as in Embodiment 1. Next, as illustrated in FIG. 17, the third metal layer 78*c* is formed as in Embodiment 1. The following manufacturing method is similar to that in Embodiment 1.

As described above, according to the method for manufacturing the semiconductor device of this embodiment, an identical method is used to form the first metal layer 18*a*, the second metal layer 78*b*, and the third metal layer 78*c*. Thus, since there is no need to change the manufacturing apparatus, for example, the semiconductor device can be easily manufactured.

Embodiment 4

Figure 18:
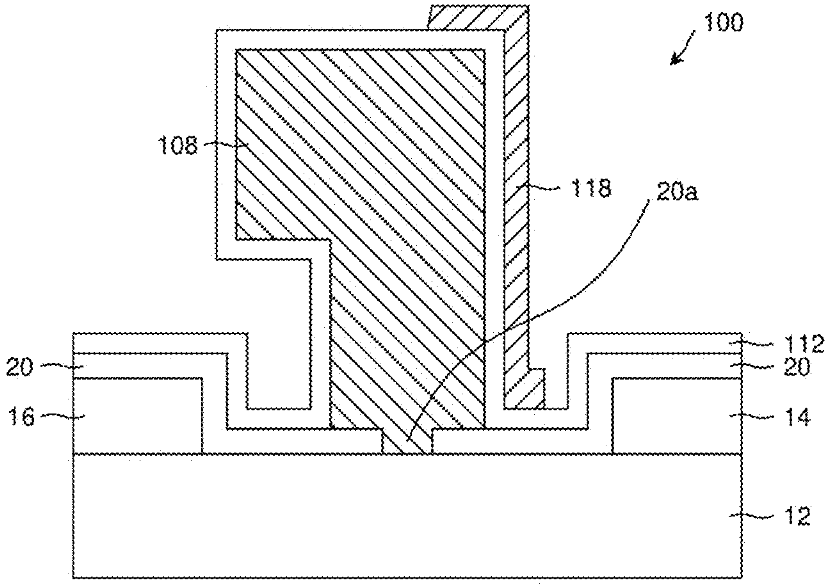
FIG. 18 illustrates a cross-sectional view of the semiconductor device according to Embodiment 4.

FIG. 18 is a cross-sectional view of a semiconductor device 100 according to Embodiment 4. In the semiconductor device 100, unlike with the semiconductor device 10 according to Embodiment 1, a side surface of a gate electrode 108 on the side of the source electrode 14 is perpendicular on the first insulating film 20. Further, an SFP electrode 118 is formed on a region from a portion of the second insulating film 112 located above the gate electrode 108 to a portion of a second insulating film 112 located between the gate electrode 108 and the source electrode 14.

Due to the presence of the SFP electrode 118, electric field concentration in the semiconductor substrate 12 around the root of the gate electrode 108 can be suppressed. In particular, since the side surface of the gate electrode 108 on the side of the source electrode 14 is perpendicular, the SFP electrode 118 can be arranged close to the gate electrode 108 at a position near the semiconductor substrate 12. This can further suppress the electric field concentration.

A method for manufacturing the semiconductor device 100 according to Embodiment 4 will be described. The manufacturing method of up to the formation of the third metal layer 18*c* (FIG. 10) is similar to that in Embodiment 1.

Figure 19:
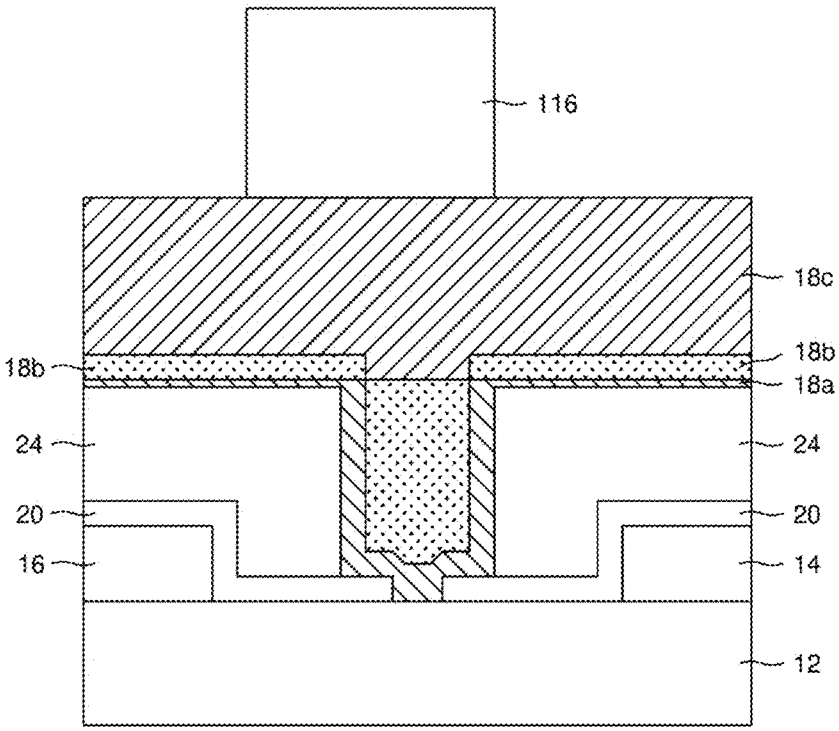
FIG. 19 is a cross-sectional view of the semiconductor device showing the method for manufacturing the semiconductor device according to Embodiment 4.

After the third metal layer is formed, as illustrated in FIG. 19, a second resist 116 is formed on the third metal layer. At this time, the second resist 116 is formed such that a side surface of the second resist 116 on the side of the source electrode 14 is located at the same position as a side surface of the second opening 24*a* in the horizontal direction, and also, a side surface of the second resist 116 on the side of the drain electrode 16 is located at a position closer to the drain electrode 16 than is a side surface of the second opening 24*a* in the horizontal direction.

Figure 20:
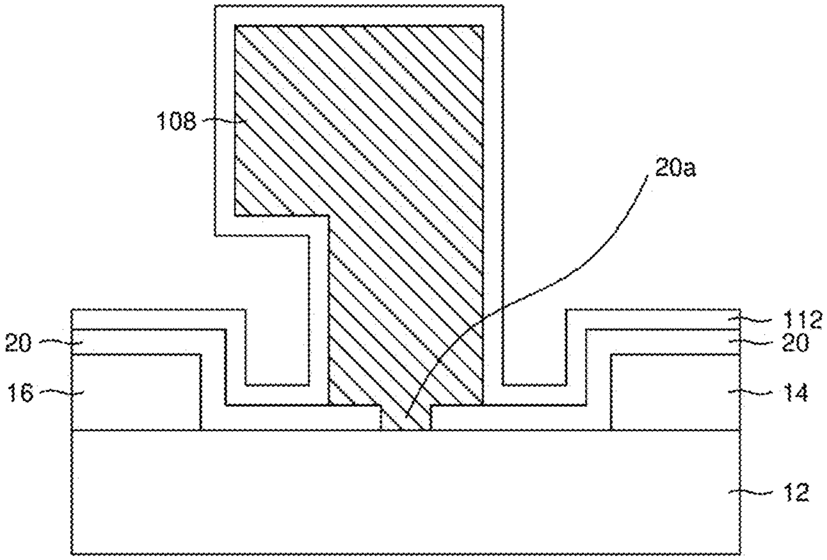
FIG. 20 is a cross-sectional view of the semiconductor device showing the method for manufacturing the semiconductor device according to Embodiment 4.

Next, as illustrated in FIG. 20, the gate electrode 108 and the first resist 24 are etched up to the middle of the first resist 24, the first resist 24 and the second resist 116 are removed, and the second insulating film 112 is formed, all through procedures similar to those in Embodiment 1.

Next, the SFP electrode 118 is formed. This completes the formation of the semiconductor device 100 in FIG. 18. The SFP electrode 118 is formed by first depositing a material of the SFP electrode using an electron beam vapor deposition method or a sputtering method, for example, and then performing lift-off.

As described above, according to the method for manufacturing the semiconductor device of this embodiment, the effect of the electric field concentration can be further enhanced because the SFP electrode 118 at a position close to the semiconductor substrate 12 is arranged close to the gate electrode 108.

Embodiment 5

Figure 21:
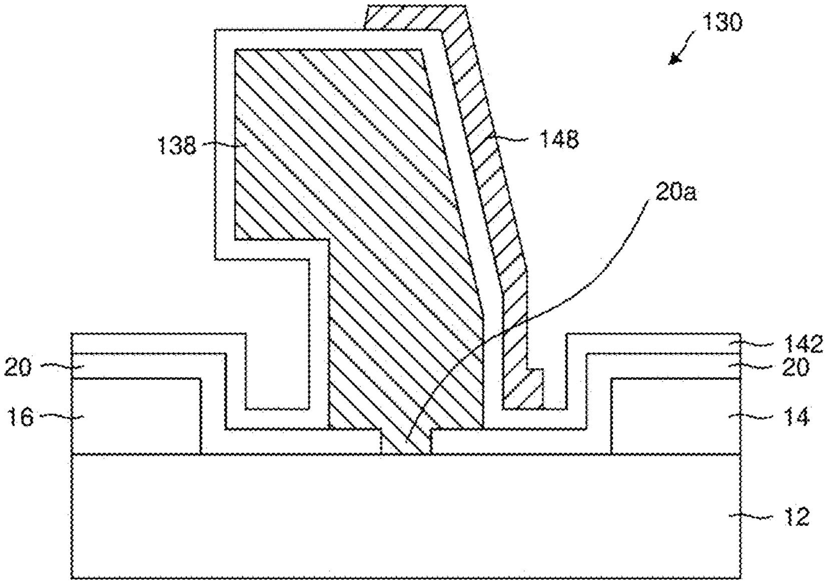
FIG. 21 illustrates a cross-sectional view of the semiconductor device according to Embodiment 5.

FIG. 21 is a cross-sectional view of a semiconductor device 130 according to Embodiment 5. In the semiconductor device 130, unlike with the semiconductor device 100 according to Embodiment 4, the upper portion of a side surface of a gate electrode 138 on the side of the source electrode 14 is inclined in a direction away from the source electrode 14 with increasing distance from the semiconductor substrate 12. An SFP electrode 148 is formed to follow such inclination.

A method for manufacturing the semiconductor device 130 according to Embodiment 5 will be described. The manufacturing method of up to the formation of the third metal layer 18*c* (FIG. 10) is similar to that in Embodiment 1.

Figure 22:
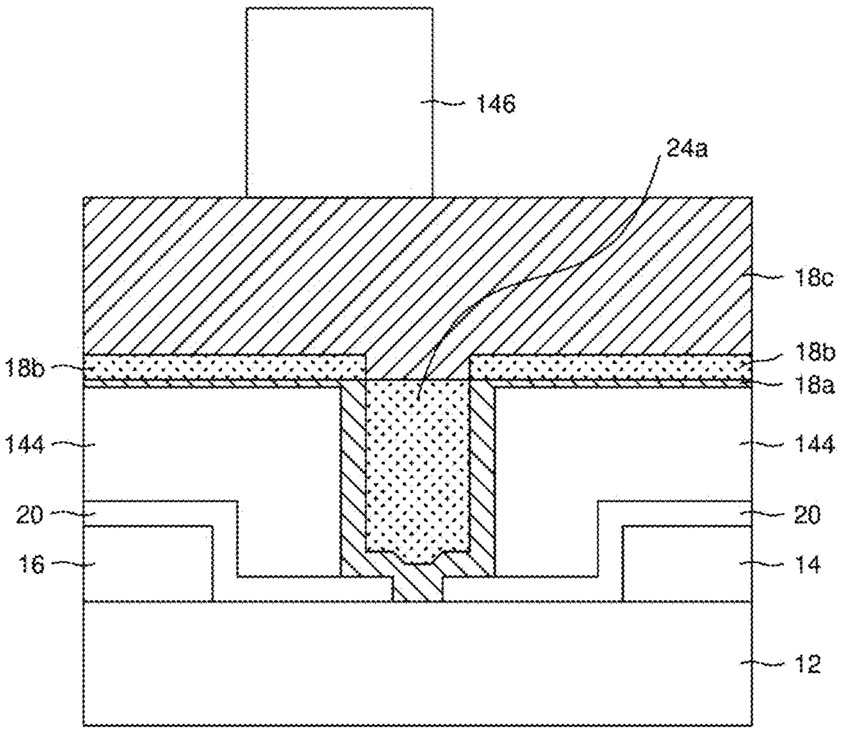
FIG. 22 is a cross-sectional view of the semiconductor device showing the method for manufacturing the semiconductor device according to Embodiment 5.

After the third metal layer 18*c* is formed, as illustrated in FIG. 22, a second resist 146 is formed on the third metal layer 18*c*. At this time, the second resist 146 is formed such that a side surface of the second resist 146 on the side of the source electrode 14 is located at the same position as the inside of the second opening 24*a* in the horizontal direction, and also, a side surface of the second resist 146 on the side of the drain electrode 16 is located at a position closer to the drain electrode 16 than is a side surface of the second opening 24*a* in the horizontal direction.

Figure 23:
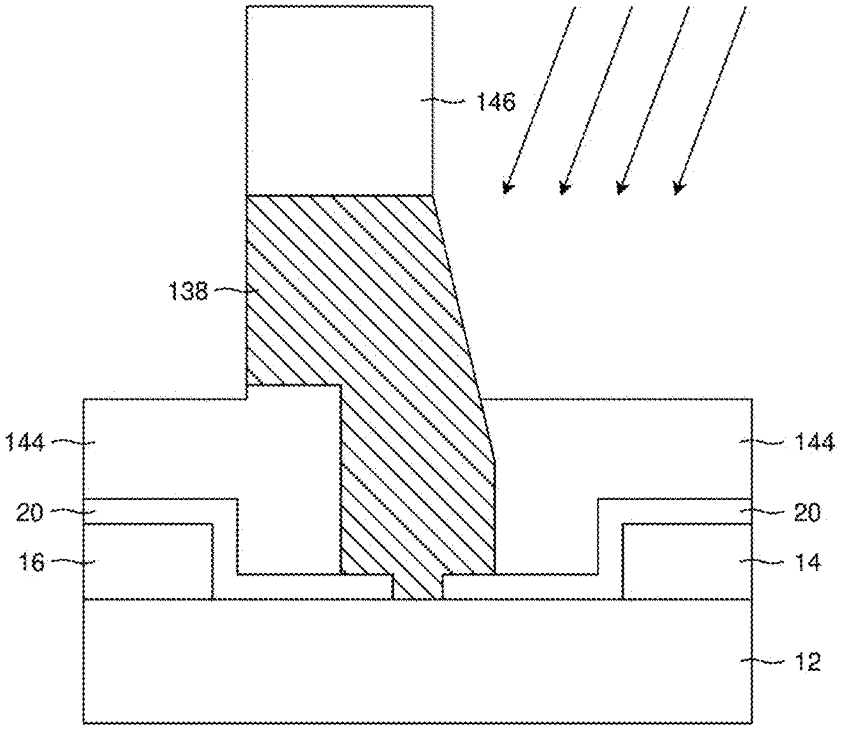
FIG. 23 is a cross-sectional view of the semiconductor device showing the method for manufacturing the semiconductor device according to Embodiment 5.

Next, as illustrated in FIG. 23, the gate electrode 138 and the first resist 144 are etched up to the middle of the first resist 144 using an oblique-incidence ion milling method. Using the oblique-incidence ion milling method allows the upper portion of a side surface of the gate electrode 138 on the side of the source electrode 14 to be formed such that it is inclined in a direction away from the source electrode 14 with increasing distance from the semiconductor substrate 12.

Figure 24:
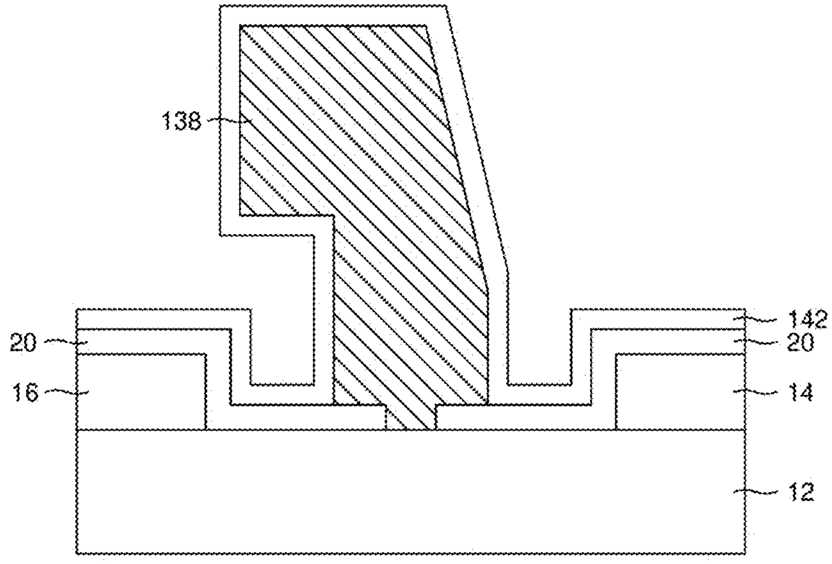
FIG. 24 is a cross-sectional view of the semiconductor device showing the method for manufacturing the semiconductor device according to Embodiment 5.

Next, as illustrated in FIG. 24, the first resist 144 and the second resist 146 are removed, and a second insulating film 142 is formed.

Next, the SFP electrode 148 is formed. This completes the formation of the semiconductor device 130 in FIG. 21.

As described above, according to the method for manufacturing the semiconductor device of this embodiment, the upper portion of the side surface of the gate electrode 138 on the side of the source electrode 14 is formed such that it is inclined in a direction away from the source electrode 14 with increasing distance from the semiconductor substrate 12. Therefore, the SFP electrode 148 at a position close to the semiconductor substrate 12 is reliably arranged close to the gate electrode 138.

REFERENCE SIGNS LIST

10, 40, 70, 100, 130 semiconductor device, 12 semiconductor substrate, 14 source electrode, 16 drain electrode, 18,48,78,108,138 gate electrode, 18*a*,48*a* first metal layer, 18*b*,78*b* second metal layer, 18*c*, 78*c* third metal layer, 20 first insulating film, 20*a* first opening, 22, 112, 142 second insulating film, 24, 144 first resist, 24*a* second opening, 26, 56, 116, 146 second resist, 118, 148 SFP electrode

The invention claimed is:

1. A method for manufacturing a semiconductor device, comprising:

forming a source electrode and a drain electrode on a semiconductor substrate;

forming, on the source electrode, the drain electrode, and the semiconductor substrate, a first insulating film including a first opening at a position between the source electrode and the drain electrode;

forming, on the first insulating film, a first resist including a second opening above the first opening, the second opening being larger than the first opening;

forming a gate electrode in the first opening, in the second opening, above the second opening, and on the first resist so as to allow the gate electrode to be in contact with the semiconductor substrate via the first opening;

forming a second resist on the gate electrode, the second resist covering at least a region above the second opening in a vertical direction, the second resist being wider than the second opening;

etching the gate electrode and up to the middle of the first resist, using the second resist as a mask;

removing the first resist and the second resist; and forming a second insulating film covering an exposed portion of the gate electrode and an exposed portion of the first insulating film, wherein:

the forming the gate electrode includes forming a first metal layer on the first resist, on a side surface of the second opening in the first resist, on the first insulating film, and in the first opening, etching the first metal layer on the first resist, forming a second metal layer on the first metal layer, etching the second metal layer over the first resist, and forming a third metal layer on the second metal layer, and the gate electrode includes the first metal layer, the second metal layer, and the third metal layer.

2. The method for manufacturing the semiconductor device according to claim 1, wherein the etching the first metal layer includes etching the first metal layer using an oblique-incidence ion milling method so as to allow a side surface of a cavity formed in the second opening to be tapered.

3. The method for manufacturing the semiconductor device according to claim 1, wherein the first metal layer, the second metal layer, and the third metal layer are formed using an electron beam vapor deposition method.

4. The method for manufacturing the semiconductor device according to claim 1, wherein:

the forming the second resist includes forming the second resist such that a side surface of the second resist on a side of the source electrode is located at a same position as a side surface of the second opening in a horizontal direction, and the etching the gate electrode and up to the middle of the first resist includes etching the gate electrode and up to the middle of the first resist using a normal-incidence ion milling method, and the method further comprises:

after the forming the second insulating film, forming an SFP electrode on a region from a portion of the second insulating film located above the gate electrode to a portion of the second insulating film located between the gate electrode and the source electrode.

5. The method for manufacturing the semiconductor device according to claim 1, wherein:

the forming the second resist includes forming the second resist such that a side surface of the second resist on a side of the source electrode is located at an inside of the second opening in a horizontal direction, the etching the gate electrode and up to the middle of the first resist includes etching the gate electrode and up to the middle of the first resist using an oblique-incidence ion milling method, and the method further comprises:

after the forming the second insulating film, forming an SFP electrode on a region from a portion of the second insulating film located above the gate electrode to a portion of the second insulating film located between the gate electrode and the source electrode.

6. A method for manufacturing a semiconductor device, comprising:

forming a source electrode and a drain electrode on a semiconductor substrate;

forming, on the source electrode, the drain electrode, and the semiconductor substrate, a first insulating film including a first opening at a position between the source electrode and the drain electrode;

forming, on the first insulating film, a first resist including a second opening above the first opening, the second opening being larger than the first opening;

forming a gate electrode in the first opening, in the second opening, above the second opening, and on the first resist so as to allow the gate electrode to be in contact with the semiconductor substrate via the first opening;

forming a second resist on the gate electrode, the second resist covering at least a region above the second opening in a vertical direction, the second resist being wider than the second opening;

etching the gate electrode and up to the middle of the first resist, using the second resist as a mask;

removing the first resist and the second resist; and forming a second insulating film covering an exposed portion of the gate electrode and an exposed portion of the first insulating film, wherein:

the forming the second resist includes forming the second resist such that a side surface of the second resist on a side of the source electrode is located at a same position as a side surface of the second opening in a horizontal direction, and the etching the gate electrode and up to the middle of the first resist includes etching the gate electrode and up to the middle of the first resist using a normal-incidence ion milling method, and the method further comprises:

after the forming the second insulating film, forming an SFP electrode on a region from a portion of the second insulating film located above the gate electrode to a portion of the second insulating film located between the gate electrode and the source electrode.

7. A method for manufacturing a semiconductor device, comprising:

forming a source electrode and a drain electrode on a semiconductor substrate;

forming, on the source electrode, the drain electrode, and the semiconductor substrate, a first insulating film including a first opening at a position between the source electrode and the drain electrode;

forming, on the first insulating film, a first resist including a second opening above the first opening, the second opening being larger than the first opening;

forming a gate electrode in the first opening, in the second opening, above the second opening, and on the first resist so as to allow the gate electrode to be in contact with the semiconductor substrate via the first opening;

forming a second resist on the gate electrode, the second resist covering at least a region above the second opening in a vertical direction, the second resist being wider than the second opening;

etching the gate electrode and up to the middle of the first resist, using the second resist as a mask;

removing the first resist and the second resist; and a forming a second insulating film covering an exposed portion of the gate electrode and an exposed portion of the first insulating film, wherein:

the forming the second resist includes forming the second resist such that a side surface of the second resist on a side of the source electrode is located at an inside of the second opening in a horizontal direction, the etching the gate electrode and up to the middle of the first resist includes etching the gate electrode and up to the middle of the first resist using an oblique-incidence ion milling method, and the method further comprises:

after the forming the second insulating film, forming an SFP electrode on a region from a portion of the second insulating film located above the gate electrode to a portion of the second insulating film located between the gate electrode and the source electrode.

* * * * *